United States Patent [19]
Honeycutt et al.

[11] Patent Number: 6,040,208
[45] Date of Patent: Mar. 21, 2000

[54] ANGLED ION IMPLANTATION FOR SELECTIVE DOPING

[75] Inventors: Jeffrey W. Honeycutt; Fernando Gonzalez; Fawad Ahmed, all of Boise, Id.

[73] Assignee: Micron Technology, Inc., Boise, Id.

[21] Appl. No.: 08/920,535

[22] Filed: Aug. 29, 1997

[51] Int. Cl.$^7$ .............................................. H01L 21/8238
[52] U.S. Cl. ...................... 438/229; 438/199; 438/275; 438/279; 438/302; 438/525
[58] Field of Search ................... 438/525, 299, 438/301, 302, 306, 307, 199, 209, 275, 229, 232, 279, FOR 169, FOR 216, FOR 217, FOR 218; 148/DIG. 11

[56] References Cited

FOREIGN PATENT DOCUMENTS

357017164  1/1982  Japan .

*Primary Examiner*—Wael Fahmy
*Assistant Examiner*—Long Pham
*Attorney, Agent, or Firm*—Workman, Nydegger & Seeley

[57] ABSTRACT

A method of implanting dopants within an exposed first active region on a semiconductor substrate of a semiconductor wafer without doping an exposed second active region of the semiconductor substrate. A barrier wall is formed adjacent to the second active region and projects from the semiconductor substrate to a height above the second active region. A minimal angle relative to an axis perpendicular to the semiconductor substrate is determined at which doping ions directed at the semiconductor substrate must travel so that the barrier wall blocks the doping ions from contacting the second active region. The doping ions are used to bombard the semiconductor substrate at an angle at least as large as the minimal angle previously determined. As a result, the doping ions contact the first active region but do not substantially contact the second active region. The width of the second active region can be formed as greater than that of the first active. In one embodiment, a buried channel of a MOS device is created, the doping concentration of which is profiled so as to optimize both the threshold voltage thereof and the depth to the beginning of the buried channel ($\gamma_J$).

33 Claims, 3 Drawing Sheets

ANGLED ION IMPLANTATION FOR SELECTIVE DOPING

BACKGROUND OF THE INVENTION

1. The Field of the Invention

The present invention relates to methods for doping an active region on a semiconductor substrate by ion implantation and, more specifically, to methods for doping a first active region without simultaneously doping a second exposed active region.

2. The Relevant Technology

Integrated circuits are manufactured by an elaborate process in which a variety of different electronic devices are integrally formed on a small semiconductor wafer. Conventional electronic devices include capacitors, resistors, transistors, diodes, and the like. In advanced manufacturing of integrated circuits, hundreds of thousands of electronic devices are formed on a single chip.

The variety of electronic devices making up an integrated circuit are formed through a series of layering and stripping steps. By selectively combining layers of conductive, nonconductive, and semiconductive material, each of the different electronic devices can be formed.

One additional step used in making different devices is doping. Doping is a process in which ions from a selected material are introduced within a portion of a layer of semiconductive material. Doping allows for selectively modifying the electrical properties of the semiconductive material of a silicon wafer. The dopants may be ion implanted or diffused.

One of the problems with doping by ion implantation is that the areas to be doped are usually extremely small. As a result, it is difficult to isolate an ion stream so that the ions only strike a desired area. One preferred method for doping is to first deposit a layer of insulative material over the semiconductive material. A photolithography step is then used to selectively remove portions of the deposited insulative layer so as to expose only the desired portions of the semiconductive material for doping.

Photolithography is a complex, multiple step process in which a layer of photoresist is deposited over a layer of material on the semiconductor wafer. Typically, the layer of material is an insulative material that overlies a semiconductor substrate. Various wavelengths of light are then exposed to the portion of the photoresist material located over the portion of the layer of insulative material that is desired to be removed. The exposed photoresist can then be removed with a developer agent. Next, the semiconductor wafer is exposed to an etching compound which can be either a gas or liquid. The etching compound etches through the portion of the layer of insulative material that is not protected by the photoresist to expose the underlying semiconductor substrate.

Once the semiconductor substrate has been exposed via the photolithography process, the semiconductor wafer is bombarded with the desired ions. A portion of the ions pass through the openings in the photoresist and insulative layer to implant and thus dope the selected areas of the semiconductor substrate.

At times it is desirable to dope a first and a second area of a semiconductive substrate with different types of ions. In so doing, however, it is necessary in some fashion to cover and protect the second area while the first area is doped and then to cover and protect the first area while the second area is doped. This prevents contamination of the different areas with unintended ion doping. Protecting the area not being doped is typically accomplished through the application of an insulation layer or a layer of photoresist as discussed above. The repeated application and removal of layers of insulation and/or photoresist, however, is both a time consuming and expensive process. This is especially true where numerous doping steps are required in the formation of an integrated circuit.

One process where the problem of doping is easily witnessed is in the formation of a complementary field effect transistor, commonly referred to as a "CMOS" transistor. A CMOS transistor is defined as a transistor having an N-channel MOS transistor and a P-channel MOS transistor on the same semiconductor substrate. During processing, a single polysilicon layer may be used to form both N-channel and P-channel gates. The N-channel devices are formed first, with unetched polysilicon left in the future P-channel regions until N-channel processing is complete. The mask used to subsequently pattern the P-channel devices is also used to blanket and protect the already formed N-channel devices, or vice versa. This process is herein referred to as the split polysilicon CMOS last process which is disclosed in Japanese patent number 57-17164 issued to Masahide Ogawa on Jan. 28, 1982.

Although the split polysilicon CMOS last process has been found an effective way in making transistors, since the gate channel in the P-channel device must be doped with a different dopant than in the N-channel device, numerous masking steps are required to prevent contamination between the two gates.

What is needed is improved methods for doping a semiconductor material by ion implantation. Improved methods are also needed for doping a first active region by ion implantation without doping an exposed second active region. It would be desirable to provide methods for doping a first active region by ion implantation without having to cover the exposed second active region. It would also be desirable to provide methods for doping a first of two exposed active regions in a minimal time as well as at a minimal cost. Additionally, it would be desirable to develop methods for producing a CMOS circuit that eliminates a masking step compared to a conventional split polysilicon P-channel last CMOS process.

SUMMARY OF THE INVENTION

In accordance with the invention as embodied and broadly described herein, a method is provided for doping by ion implantation an exposed first active region of a semiconductor substrate without doping an exposed second active region of the semiconductor substrate. The second active region is bounded on at least one side by a barrier wall projecting from the semiconductor substrate. The barrier wall extends to a height above the second active region.

The method comprises the initial step of exposing the first and second active regions by etching in a single etch step. The method next comprises determining a minimal angle relative to an axis perpendicular to the plane of a semiconductor substrate situated on a semiconductor wafer at which doping ions directed at the semiconductor substrate must travel so that the barrier wall blocks the doping ions from contacting the second active region. The semiconductor substrate, as referenced herein, is one or more layers or structures, preferably composed of silicon, on a semiconductor wafer. Following a determination of the minimum angle, the doping ions are made to bombard the semiconductor substrate at an angle at least as large as the minimal angle previously determined. As a result, the doping ions are free to contact the first active region but are blocked by the barrier wall from contacting the second active region.

The amount of the first active region that is contacted by the doping ions is increased as the minimal angle required to block the ions is decreased. The minimal angle is decreased as the height of the barrier wall is increased and/or the width of the second active region is decreased.

The inventive doping process can be used during the formation of any integrated circuit or discrete device where it is desirable to independently dope two separate regions. By using the present method, at least one masking step can be eliminated as compared to conventional processes for opposite doping of two separate regions.

One of the preferred methods for employing the present invention is in the formation of a split polysilicon CMOS circuit formed using the P-channel last process. More specifically, once the NMOS transistor is substantially completed, a single etching step can be used to expose a series of NMOS gates between a series of vertical memory array components and to expose the PMOS gate. Using the inventive process of doping by angled ion implantation, the PMOS gate and channel can be doped while the vertical memory array components prevent doping of the NMOS gates. The inventive process uses the existing masking pattern that exposed the NMOS and PMOS gate layers through an etch, in conjunction with the subsequent step of angled ion implantation that only penetrates into the exposed N-well and not into the exposed P-well. The implantation is controlled to form a buried P-channel in the N-well in which both threshold voltage ($V_T$) and the depth to the beginning of the buried channel ($\gamma_J$) are controlled.

The method can be applied to individually control the $V_T$ and punch through characteristics of a PMOS transistor in a CMOS device with a single combined masking and etching step to expose both PMOS and NMOS gate surfaces without adjusting the $V_T$ of the NMOS gates. The method also allows for a controlled $\gamma_J$ of a buried channel in connection with the achieved $V_T$.

The inventive method allows for achievement of a buried channel without an additional masking step beyond formation of contact channels in the complementary portion of the CMOS device. Strict control over the channel can be achieved by the gate that is positioned over the buried channel by having the buried channel at a selected depth, dopant concentration, dopant profile, and thickness.

In the present invention, a structure is achieved by the inventive method in which the contacts for an array of N-channel devices are all the same size but the contacts for an array of P-channel devices are significantly larger. The contacts above the channels are exposed by a single masking and etching step, and implant profiling of the P-channel is accomplished with the same mask that was used to expose the contacts above the channels, while no additional implanting occurs within the N-channels.

These and other features of the present invention will become more fully apparent from the following description and appended claims, or may be learned by the practice of the invention as set forth hereinafter.

BRIEF DESCRIPTION OF THE DRAWINGS

A more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
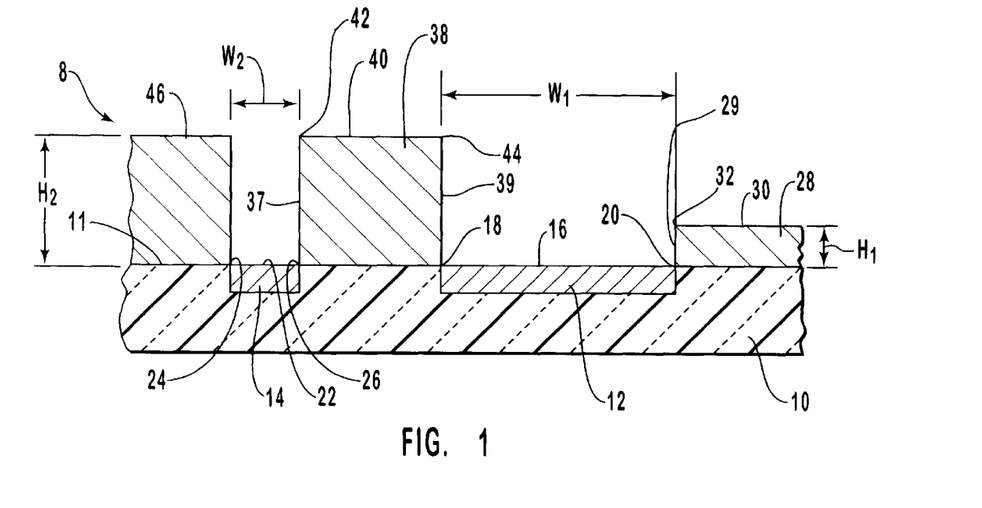
FIG. 1 is an elevated cross-sectional view of a semiconductor substrate having a first active region, a second active region, and a barrier wall extending therebetween.

Disclosed in FIG. 1 is a simplified view of a semiconductor wafer 8 having a semiconductor substrate 10. Semiconductor substrate 10 includes a first active region 12 and a second active region 14 positioned along a top surface 11. First active region 12 includes an exposed top surface 16 having a width $W_1$ extending between a first edge 18 and an opposing second edge 20. Likewise, second active region 14 also has an exposed top surface 22 having a width $W_2$ extending between a first edge 24 and an opposing second edge 26.

Projecting from substrate 10 adjacent to second edge 20 of first active region 12 is a first barrier wall 28. Barrier wall 28 has a side surface 29, a top surface 30, and a height $H_1$ that extends between top surface 11 of semiconductor substrate 10 and top surface 30. In addition, barrier wall 28 has a first edge 32 at the intersection of top surface 30 and side surface 29.

Projecting from semiconductor substrate 10 between first active region 12 and second active region 14 is a second barrier wall 38. Second barrier wall 38 has a first side surface 37 facing second active region 14 and an opposing second side surface 39 facing first active region 12. Second barrier wall 38 also has a top surface 40 and a height $H_2$ that extends between top surface 11 of semiconductor substrate 10 and top surface 40. Top surface 40 extends between a first edge 42 and an opposing second edge 44. First edge 42 intersects with first side surface 37 while second edge 44 intersects with second side surface 39. A third barrier wall 46 projects from substrate 10 adjacent to first edge 24 of second active region 14. Third barrier wall 46 has substantially the same configuration as second barrier wall 38.

The present invention relates to methods for doping first active region 12 by ion implantation without simultaneously doping exposed second active region 14. Furthermore, the doping of first active region 12 is accomplished without the time consuming and expensive step of covering second active region 14 with an insulator such as an oxide or a layer of photoresist.

Figure 2:
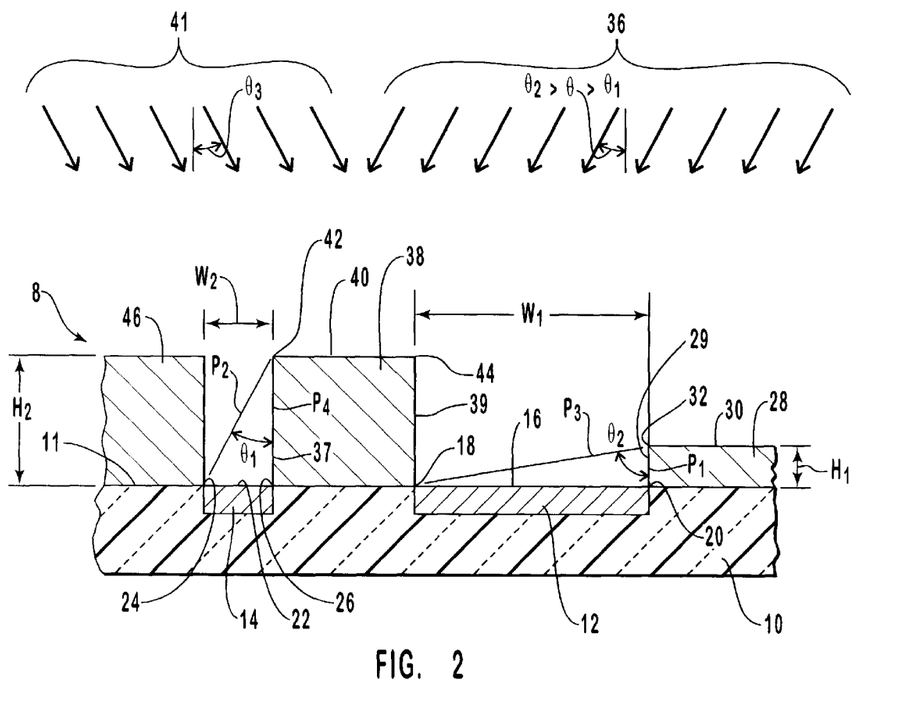
FIG. 2 is an elevated cross-sectional view of the semiconductor substrate of FIG. 1 showing ions being directed at the first active region at an angle that prevents the ions from contacting the second active region.

FIG. 2 discloses that by bombarding semiconductor substrate 10 with ions 36 at an angle θ that is greater than an angle $θ_1$ but less than an angle $θ_2$, ions 36 are precluded from contacting second active region 14, but are permitted to contact and thus dope first active region 12. More specifically, by bombarding with ions 36 at angle θ, second barrier wall 38 blocks ions 36 from contacting second active region 14, but first barrier 28 wall does not block ions 36 from contacting first active region 12.

The minimal angle $θ_1$ at which ions 36 will bombard a surface in order to prevent contact with second active region 14 is dependent on height $H_2$ of second barrier wall 38 and width $W_2$ of second active region 14. More specifically, angle $θ_1$ is measured as the angle between a plane $P_1$ positioned perpendicular to the plane of the semiconductor wafer, seen in FIG. 2 as top surface 11 of semiconductor substrate 10, and a plane $P_2$ extending between first edge 42 of top surface 40 of first barrier wall 38 and first edge 24 of surface 22 of second active region 14. Accordingly, angle $θ_1$ varies as height $H_2$ and width $W_2$ vary.

The maximum angle $θ_2$ at which ions 36 will bombard a surface in order to still contact first active region 12 is likewise dependent on height $H_1$ of first barrier wall 28 and width $W_1$ of first active region 12. More specifically, angle $θ_2$ is measured as the angle between a plane $P_1$ positioned perpendicular to top surface 11 of semiconductor substrate 10 and a plane $P_3$ extending between first edge 32 of top surface 30 of first barrier wall 28 and first edge 18 of top surface 16 of first active region 12.

If ions 36 are used to bombard at an angle greater than $θ_2$, ions 36 will be blocked by first barrier wall 28 and second barrier wall 38 so as to preclude ions 36 from contacting either first active region 12 or second active region 14. If ions 36 are used to bombard at an angle less than $θ_1$, ions 36 will contact both first active region 12 and second active region 14. In contrast, however, if ions 36 are used to bombard at an angle greater than $θ_1$ but less than $θ_2$, ions 36 are blocked by second barrier wall 38 from contacting second active region 14 but ions 36 are not blocked by first barrier wall 28 from contacting first active region 12.

It is generally preferred to be able to dope as much of first active region 12 as possible. As such, it is preferred that angle θ for ions 36 implantation be only slightly larger than angle $θ_1$. As angle θ of ions 36 implantation increases relative to angle $θ_1$, the portions of first active region 12 that are doped is correspondingly decreased. The portion of first active region 12 that is not doped begins at second edge 20 and extends to first edge 18 as angle θ increases.

As seen in FIG. 2, angle θ is directed relative to the axis perpendicular to semiconductor substrate 10 so that ions 36 strike against second side surface 39 of second barrier wall 38. In an alternative embodiment, ions 41 can also be directed at an angle θhd 3so that ions 41 strike against first side surface 37 of second barrier wall 38. By delivering both ions 36 and 41 at their respective angles θ and $θ_3$, it is easier to insure that all of first active region 12, especially from edge 18 to edge 20, is fully doped by both of ions 36 and ions 41.

In determining the proper orientation for angle $θ_3$, third barrier wall 46 functions to block ions 41 from striking second active region 14 while second barrier wall 38 blocks ions 41 from fully contacting the entire length of first active region 12 along substrate 10. As such, angle $θ_3$ must be sufficiently large to allow third barrier wall 46 to block ions 41 but small enough to so that ions 41 can strike first active region 12. Using the same principles as discussed above, the preferred orientation of angle $θ_3$ is thus related to the height of second and third barrier walls 38 and 46 and the width $W_1$, $W_2$, respectively, of first and second active regions 12 and 14.

As previously mentioned, the orientation for θ and $θ_3$ is dependent on the configuration of the active regions and the corresponding barrier walls. It is generally envisioned, however, that θ and $θ_3$ will be at an angle in a range between about 1 degree to about 20 degrees with about 1 degree to about 10 degrees being more preferred.

The amount of first active region 12 that is doped is also increased as angle $θ_1$ decreases and angle $θ_2$ increases. Angle $θ_1$ decreases as width $W_2$ decreases and height $H_2$ increases. Likewise, angle $θ_2$ increases as width $W_1$ increases and height $H_1$ decreases. Accordingly, by maximizing the structural elements as outlined above, an optimal configuration can be obtained for doping most of first active region 12 without doping second active region 14.

In alternative embodiments, the present inventive process can be performed in the absence of individual or combinations of barrier walls 28, 38, and 46. However, at least one barrier wall is needed to block ions 36. The position of the barrier wall is dependent on the angle that the ions are being delivered.

The above inventive method for doping by angled ion implantation can be carried out on a number of different structural configurations using the principles disclosed herein. The embodiment as shown in FIGS. 1 and 2 is a simplified view of one structural embodiment. By way of example and not by limitation, substrate 10 can comprise a discrete device or single or multiple layers of integrated devices. Barrier walls 28, 38, and 46 can comprise a layer of photoresist or an insulative layer such as silicon oxide or silicon nitride. In addition, barrier walls 28, 38 and 46 can comprise combined layers of different materials such as in the formation of memory arrays including both DRAM and SRAM. Additionally, barrier walls 28, 38, and 46 can be of uniform height such that $H_1$ is equal to $H_2$.

Active regions 12 and 14 can comprise any portion of an integrated or discrete circuit needed to be doped or patterned. By way of example and not by limitation, such portions can comprise conductive layers, N-P junctions, PMOS gates and channels, and NMOS gates and channels.

Figure 3:
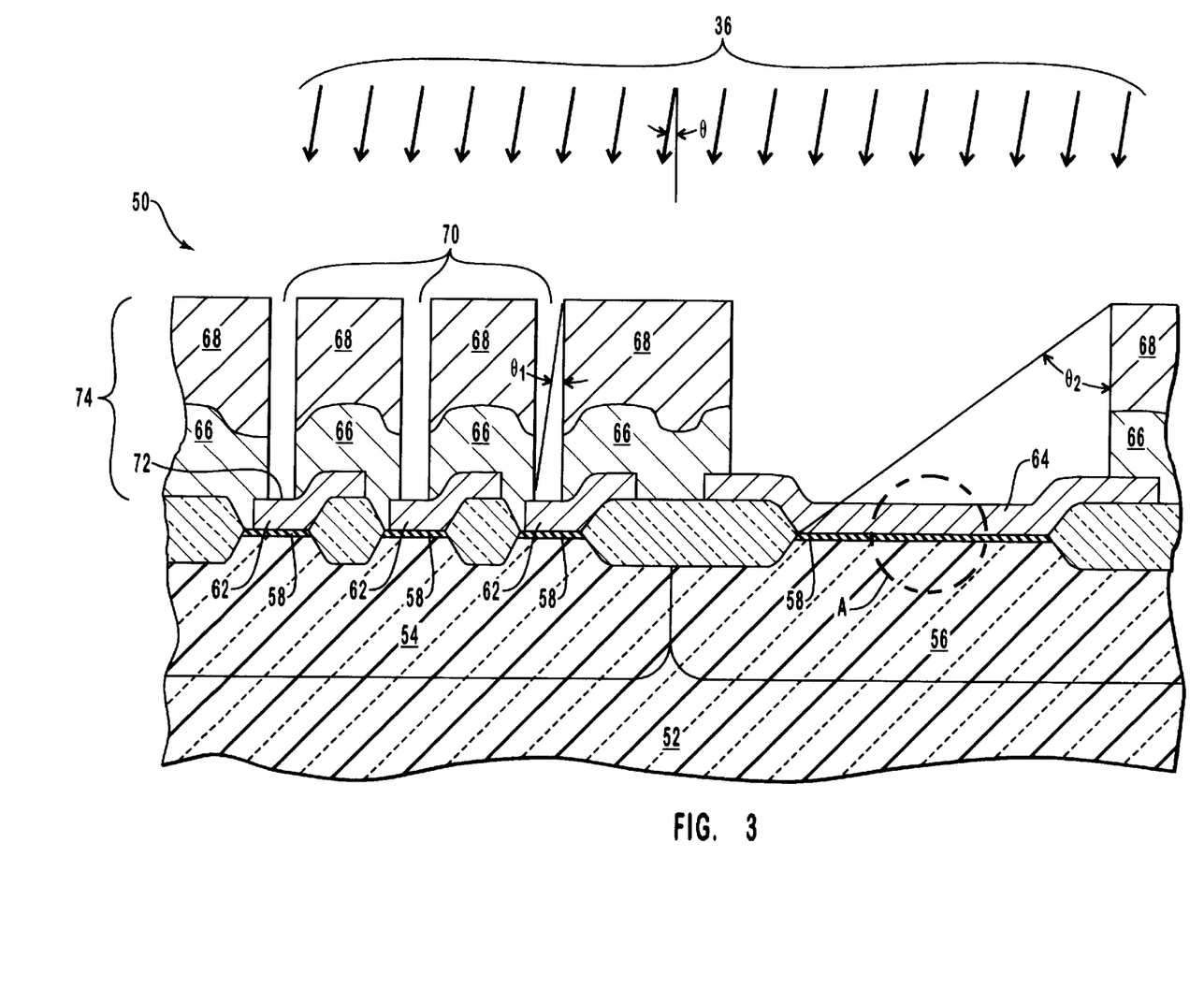
FIG. 3 is an elevated cross-sectional view of a partially formed CMOS transistor having an exhumed contact mask. Ions are being directed at the illustrated structure, the ions being directed at an angle that will permit doping of a P-channel but will prevent doping of an N-channel.

One preferred use of the above inventive method of doping by angled ion implantation is in the formation of split polysilicon CMOS circuit using a P-channel last process. Disclosed in FIG. 3, is a partially completed CMOS device 50 formed using the standard P-channel last process.

Partially formed CMOS device 50 is shown as comprising a semiconductor substrate 52 having a doped P-well 54 and an adjacent doped N-well 56. When CMOS device 50 is completed, an NMOS transistor will be formed over P-well 54 and a PMOS transistor will be formed over N-well 56. Grown over P-well 54 and N-well 56 is a gate oxide layer 58. A local oxidation of silicon (LOCOS) process is used to grow enlarged and selectively spaced oxide sites 60 by use of a nitride layer (not shown) such as $Si_3N_4$ or its equivalents, between the LOCOS regions. Other types of insulative barrier structures such as field oxide could also be used. The $Si_3N_4$ spacers are removed and if needed, gate oxide layer 58 is formed upon the exposed P-well and N-well substrate regions.

Deposited over oxide sites 60 and gate oxide layer 58 is a polysilicon layer shown at 62 and 64. The portion of the polysilicon layer over P-well 54 has been etched to form a plurality of distinct gates 62. Each of gates 62 individually cover a portion of gate oxide layer 58 and a portion of an adjacent oxide site 60. The portion of the polysilicon layer over N-well 56 has not yet been etched and thus forms a single elongated gate layer 64. Single elongated gate 64 is illustrated in FIG. 3 as being longer than each of gates 62. Gates 62 will preferably have the same length, as is illustrated in FIG. 3.

A blanket oxide layer 66 is next deposited over the polysilicon layer following which a photoresist layer 68 is deposited and patterned over oxide layer 66. Etching is then used to form narrow contact channels 70 down through photoresist layer 68 and oxide layer 66 to each of gates 62. Contact channels 70 expose a contact surface 72 on each of gates 62 above gate oxide layer 58. The formation of contact channels 70 converts photoresist layer 68 and gates 62 into a plurality of vertical arrays 74 having a general SRAM configuration for example. The same process used to form contact channels 70 has also be used to completely remove the portion of photoresist layer 68, blanket oxide layer 66, and the polysilicon layer over gate layer 64.

As shown in FIG. 3, the NMOS transistor formed over P-well 54 is substantially completed. Namely, each of gates 62 and their corresponding source, drain, and channel are already formed and properly doped. It is noted that to clearly illustrate contact channels 70, FIG. 3 has been drawn at an angle so that each gate 62 travels horizontally at a 45 degree angle into and out of the page. As such, the source and drain are not shown since they are also positioned into and out of the page on opposing sides of each of gates 62.

In contrast to the NMOS transistor, the PMOS transistor is just now ready to be formed over N-well 56. The initial step in so doing is to dope a portion of N-well 56 below gate oxide layer 58 to form a structure that will later function as a P-channel 76 that will allow a current to pass between a source and a drain (not shown) when a threshold voltage ($V_T$) is applied to gate layer 64.

Conventional methods could be used to dope the region that will become channel 76 prior to formation of gate oxide layer 58 and polysilicon gate layer 64 over P-channel 76. In contrast, the present invention discloses blanket doping CMOS device 50 by bombarding the same with ions 36 at an angle θ such that at angle θ, ions 36 will penetrate gate layer 64 but will not contact gates 62 due the aspect ratio of the height of vertical arrays 74 with respect to the narrowness of contact channels 70. Ions 36 penetrate polysilicon gate layer 64, gate oxide 58, and P-channel 76 of N-well 56. By measurement of the thickness of polysilicon gate layer 64 and gate oxide 58, P-channel 76 can be more accurately doped.

As previously mentioned, the threshold voltage ($V_T$) is the amount of voltage that must be applied to gate layer 64 to cause a current to pass between its corresponding source/drain regions. It is preferable to be able to construct the PMOS transistor so that it has a selected threshold voltage. In general, the threshold voltage is dependent on the thickness and electrical properties of polysilicon gate layer 64 and gate oxide 58. The threshold voltage is also dependent on the electrical properties of P-channel 76. That is, by selectively doping P-channel 76 with proper ion doping, the threshold voltage can be increased or decreased.

By doping P-channel 76 sequentially last in a process flow, it is possible to first measure the physical and electrical properties of gate layer 64 and oxide layer 58 prior to the doping step. As a result, a more exact determination can be obtained as to what kind and how much dopant should be implanted within P-channel 76 so as to obtain the defined voltage threshold. By way of example and not by limitation of such doping, boron and phosphorus ions can be used.

If the selected doping ions are used to bombard at an angle perpendicular to the surface of gate layer 64, each of gates 62 must be covered or insulated so as to prevent contamination by the ions. The present invention provides that by bombarding with ions 36 at gate layer 64 at angle θ seen in FIG. 3, ions 36 will pass through gate layer 64 to dope P-channel 76. Vertical arrays 74, however, will block ions 36 from contacting gates 62. More specifically, vertical arrays 74 in FIG. 3 act as does second barrier wall 38 in FIGS. 1 and 2. Accordingly, by calculating angle $\theta_1$ for contact surface 72 of FIG. 3 in the same manner that angle $\theta_1$ was calculated for second active region 14 in FIG. 1, the minimal angle can be determined at which ions must be used to bombard gate layer 64 to prevent dopant contamination of gates 62. To further optimize the amount of P-channel 76 that is doped, it is again possible to modify the structural components of CMOS device 50. More specifically, the height of vertical array 74 can be increased and the width of contact channel 70 decreased.

The present invention may be practiced in the formation of a split polysilicon CMOS device formed using the P-channel last process for both SRAM and DRAM circuits and devices. More specifically, once the NMOS transistor is substantially completed, a single etching step can be used to expose a series of NMOS gates between a series of vertical memory array components and to expose the PMOS gate.

Although the present invention discloses application of the methods of forming CMOS devices, it is contemplated that any structure in the microelectronic arts that can potentially expose plural active regions through a single mask, can be blanket doped as to only selected regions by virtue of vertical array heights in combination with exposed region widths.

Using the inventive process of doping by angled ion implantation, the P-channel below the PMOS gate can be doped while vertical arrays 74 and/or contact channel widths 70 prevent doping of the N-channel below each NMOS gate 62. The inventive process uses the existing masking pattern that exposed the NMOS and PMOS gates layers through an etch, in conjunction with the subsequent step of angled ion implantation that only penetrates into the exposed N-well and not into the exposed P-well.

Figure 4A:
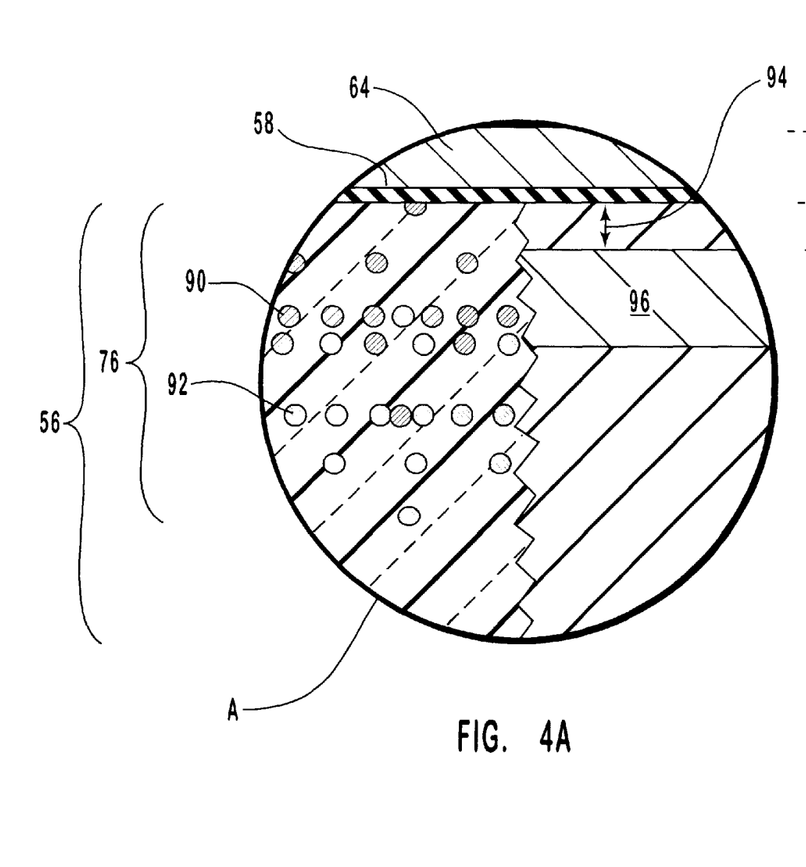
FIG. 4 is a section taken from FIG. 3 in which dopant concentration profiling of a P-channel in an N-well is detailed.
Figure 4B:
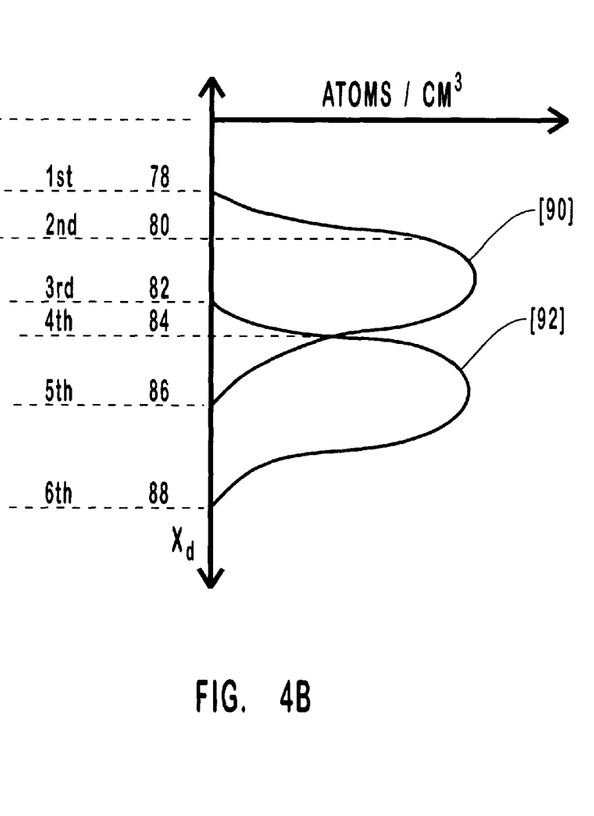

FIG. 4 highlights a section A taken from FIG. 3 in which P-channel 76 is detailed. Implantation of boron and phosphorus is done to create a buried P-channel 96 in N-well 56 with strictly defined regions. These strictly defined regions allow for control of $V_T$ of P-channel 96 that is achieved in process with the same mask that has used for exposing both N-well contacts and P-well contacts. The contacts above the P-well, while exposed, are not implanted as described above.

The implantation is controlled to form a buried P-channel in the N-well in which both $V_T$ and $\gamma_J$ are controlled. By way of example the method is applied to adjust the $V_T$ of a PMOS transistor in a CMOS device with a single combined masking and etching step to expose both PMOS and NMOS gate surfaces without adjusting the $V_T$ of the NMOS gates.

In this method, after etching contacts above each of the channels, a first ion implantation is carried out at the angle θ as set forth above. The first ion implantation embeds boron 90, by way of non-limiting example, beneath gate oxide layer 58 into N-well 56. The structure of vertical arrays 74 and/or the narrowness of contact channel 70 precludes implantation of boron into gates 62 but not into gate layer 64.

A second ion implantation of phosphorus 92, for example, embeds the phosphorus into N-well 56, for the most part deeper than boron 90. The first and second implantations can be done simultaneously, or in reversed order.

In FIG. 4, the details of boron 90 and phosphorus 92 implantations are depicted. Section A, seen in FIG. 3 as a cut-away view of N-well 56, gate layer 64, and pad oxide 58, is blown up in proportion in FIG. 4. Section A illustrates both macroscopic and microscopic simplifications, not drawn to scale, of the result of implantation. The graph to the right of Section A depicts both the boron concentration [90] and the phosphorous concentration [92] plotted along the abscissa in atoms per $cm^3$ with respect to dopant depths in the P-channel along the ordinate ($X_d$). The graph shows that a desired distribution of implantation for each of the boron concentration [90] and the phosphorous concentration [92] is a Gaussian distribution. After implantation, thermal cycles will alter the Gaussian distribution through dopant diffusion.

The overlap of concentration of some dopant atoms is depicted in FIG. 4. The boron concentration [90] begins just below gate oxide layer 58 at a first depth 78 and continues into N-well 56 to a fifth depth 86. The phosphorous concentration [92] begins at a third depth 82 and continues into N-well 56 to a sixth depth 88.

At a second depth 80, a threshold boron concentration [90], depicted in arbitrary units, is sufficient to create the beginning of P-channel 96 as well as a depth 94 to the beginning of P-channel 96. Boron concentration [90] achieves a second threshold at a fourth depth 84 at which boron concentration [90] and phosphorus concentration [92] electrically cancel out the effect one to the other. Fourth depth 84 marks the distinct end of P-channel 96.

The left side of Section A is a simplified microscopic illustration of the presence of boron 90 and phosphorus 92 within P-channel 76 after the first and second implantations. The right side of Section A is a simplified macroscopic illustration of the two dopants 90,92 as they form a distinct $\gamma_J$ seen at 94, which is intended to represent the distance from a top surface of N-well 56 below gate oxide 58 to the beginning of a buried channel 96 at second depth 80. The bottom of buried channel 96 is seen in FIG. 4 at fourth depth 84.

Optimized control of $V_T$ is achieved in the single-mask technique of the present invention by first measuring the thickness of gate layer 64 and gate oxide layer 58 prior to implantation of boron 90 and phosphorus 92 or equivalent of combinations, and determining the required amounts and energies of implantation of dopant atoms for desired channel qualities. By using the angled implantation and the single mask with etch technique of the present invention, a dopant concentration profiled P-channel 76 is accomplished in the form of buried channel 96. The eventual gate formed from gate layer 64 will be enabled to have more control over conduction in buried channel 96. Further advantages are that buried channel 96 can conduct more current in the on state, can better prevent the conduction of current in the off state, can be smaller in geometry due to its inherent higher conductivity, and can be narrower in the width thereof.

In the present invention a structure is achieved by the inventive method in which the N-channels are all the same size but the P-channels are significantly larger. The channel contact structures are accomplished by a single combined masking and etching step, and implant profiling of the P-channel is accomplished with the same mask that was used to form the contacts to the channels, while no additional implanting occurs within the N-channels 23 above the P-well.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of implanting a semiconductor substrate comprising:

forming a first active region in an N-doped well within a semiconductor substrate that is oriented in a major plane, the first active region extending at a top surface of the semiconductor substrate from a first side to a second side separated by a first length;

forming a first barrier wall extending from the first side of the first active region to a top surface;

forming a second barrier wall extending from the second side of the first active region to a top surface;

forming a second active region in a P-doped well within the semiconductor substrate, the second active region extending at the top surface of the semiconductor substrate from a first side to a second side separated by a second length parallel to and less than the first length;

forming a third barrier wall extending from the first side of the second active region to a top surface, the first, second, and third barrier walls each projecting above the semiconductor substrate, wherein:

the shortest line taken from the top surface of the third barrier wall to the second side of the second active region makes a first angle with respect to an axis perpendicular to the major plane of the semiconductor substrate; and the shortest line taken from the top surface of the first barrier wall to the second side of the first active region makes a second angle with respect to the axis perpendicular to the major plane of the semiconductor substrate;

bombarding the semiconductor substrate with doping ions at a third angle with respect to the axis perpendicular to the major plane of the semiconductor substrate that is less than the second angle and greater than the first angle.

2. A method of implanting a semiconductor substrate as recited in claim 1, wherein said third angle is a range of angles between about 1 degree to about 20 degrees.

3. A method of implanting a semiconductor substrate as recited in claim 1, wherein forming a first active region in an N-doped well is conducted prior to forming a second active region in a P-doped well.

4. A method of implanting a semiconductor substrate as recited in claim 1, wherein forming a second active region in a P-doped well is conducted prior to forming a first active region in an N-doped well.

5. A method of implanting a semiconductor substrate as recited in claim 1, wherein the doping ions are both N-type and P-type doping ions, and wherein the first active region has bombarded therein a greater concentration of P-type ions at a first depth and a greater concentration of N-type ions at a second depth greater than the first depth.

6. A method of implanting a semiconductor substrate as recited in claim 5, wherein the N-type and P-type doping ions penetrate the first active region while the N-type and P-type doping ions are prevented from penetrating the second active region by the second and third barrier walls.

7. A method of implanting a semiconductor substrate as recited in claim 5, wherein the P-type doping ions comprise boron ions and N-type doping ions comprise phosphorous ions.

8. A method of implanting a semiconductor substrate as recited in claim 5, wherein the first active region has bombarded therein said P-type ions within at a first selected depth range and has bombarded therein said N-type ions within a second selected depth range, said first depth range being a shallower depth than that of the second depth range, said first depth range overlapping the second depth range.

9. A method of implanting a semiconductor substrate as recited in claim 1, wherein the first, second, and third barrier walls are separated one from another and each comprises a layer of photoresist and an electrical insulation layer, and wherein the layer of photoresist and the electrical insulation layer are patterned and etched simultaneously to simultaneously form the first, second, and third barrier walls.

10. A method of implanting a semiconductor substrate as recited in claim 1, wherein the semiconductor substrate is substantially composed of monocrystalline silicon.

11. A method of implanting a semiconductor substrate comprising:

forming a first active region in an N-doped well within a monocrystalline semiconductor substrate that is oriented in a major plane, the first active region extending at a top surface of the semiconductor substrate from a first side to a second side separated by a first length;

forming a first barrier wall extending from the first side of the first active region to a top surface;

forming a second barrier wall extending from the second side of the first active region to a top surface;

forming a second active region in a P-doped well within the monocrystalline semiconductor substrate, the second active region extending at the top surface of the semiconductor substrate from a first side to a second side separated by a second length parallel to and less than the first length;

forming a third barrier wall extending from the first side of the second active region to a top surface, the first, second, and third barrier walls each projecting above the semiconductor substrate, wherein:

the shortest line taken from the top surface of the third barrier wall to the second side of the second active region makes a first angle with respect to an axis perpendicular to the major plane of the semiconductor substrate; and the shortest line taken from the top surface of the first barrier wall to the second side of the first active region makes a second angle with respect to the axis perpendicular to the major plane of the semiconductor substrate;

the first, second, and third barrier walls are separated one from another and each comprises a layer of photoresist and an electrical insulation layer, and wherein the layer of photoresist and the electrical insulation layer are patterned and etched simultaneously to simultaneously form the first, second, and third barrier walls; and bombarding the semiconductor substrate with doping ions at a third angle between about 1 degree to about 20 degrees with respect to the axis perpendicular to the major plane of the semiconductor substrate that is less than the second angle and greater than the first angle, wherein the doping ions are both N-type and P-type doping ions, and wherein the first active region has bombarded therein a greater concentration of P-type ions at a first depth and a greater concentration of N-type ions at a second depth greater than the first depth, wherein the first active region has bombarded therein said P-type ions within a first selected depth range and has bombarded therein said N-type ions within a second selected depth range, said first depth range being a shallower depth than that of the second depth range, said first depth range overlapping the second depth range.

12. A method of implanting a semiconductor substrate comprising:

forming a first active region in an N-doped well within a monocrystalline semiconductor substrate that is oriented in a major plane, the first active region extending at a top surface of the semiconductor substrate from a first side to a second side separated by a first length;

forming a first barrier wall extending from the first side of the first active region to a top surface;

forming a second barrier wall extending from the second side of the first active region to a top surface;

forming a plurality of second active regions in a P-doped well within the monocrystalline semiconductor substrate, each said second active region extending at the top surface of the semiconductor substrate from a first side to a second side separated by a second length parallel to and less than the first length, each said second active region having a third barrier wall extending from the first side of said second active region to a top surface, wherein:

for each said second active region, the shortest line taken from the top surface of the third barrier wall to the second side of said second active region makes a first angle with respect to an axis perpendicular to the major plane of the semiconductor substrate; and the shortest line taken from the top surface of the first barrier wall to the second side of the first active region makes a second angle with respect to the axis perpendicular to the major plane of the semiconductor substrate; and bombarding the semiconductor substrate with both N-type and P-type doping ions at a third angle with respect to the axis perpendicular to the major plane of the semiconductor substrate that is less than the second angle and greater than the first angle, the first active region having bombarded therein a greater concentration of P-type ions at a first depth and a greater concentration of N-type ions at a second depth greater than the first depth.

13. A method of implanting a semiconductor substrate as recited in claim 12, wherein each said third angle is between about 1 degree to about 20 degrees.

14. A method of implanting a semiconductor substrate as recited in claim 12 wherein the P-type doping ions comprise boron ions and N-type doping ions comprise phosphorous ions.

15. A method of implanting a semiconductor substrate as recited in claim 12, wherein each of the first barrier wall, the second barrier wall, and said third barrier walls are separated one from another and comprise a layer of photoresist and an electrical insulation layer, and wherein each said layer of photoresist and the electrical insulation layer are patterned and etched simultaneously to simultaneously form the first barrier wall, the second barrier wall, and the third barrier walls.

16. A method of implanting a semiconductor substrate as recited in claim 12, wherein each said second length separating the first and second sides of each of said plurality of second active regions has substantially the same length.

17. A method of implanting a semiconductor substrate as recited in claim 12, wherein the first active region has bombarded therein said P-type ions within at a first selected depth range and has bombarded therein said N-type ions within a second selected depth range, said first depth range being a shallower depth than that of the second depth range, said first depth range overlapping the second depth range.

18. A method of implanting a semiconductor substrate comprising:
   forming a first active region in an N-doped well within a monocrystalline semiconductor substrate that is oriented in a major plane, the first active region extending at a top surface of the semiconductor substrate from a first side to a second side separated by a first length;
   forming a first barrier wall extending from the first side of the first active region to a top surface;
   forming a second barrier wall extending from the second side of the first active region to a top surface;
   forming a plurality of second active regions in a P-doped well within the monocrystalline semiconductor substrate, each said second active region extending at the top surface of the semiconductor substrate from a first side to a second side separated by a second length parallel to and less than the first length, wherein each said second length separating the first and second sides of each of said plurality of second active regions has substantially the same length, each said second active region having a third barrier wall extending from the first side of said second active region to a top surface, wherein:
      for each said second active region, the shortest line taken from the top surface of the third barrier wall to the second side of said second active region makes a first angle with respect to an axis perpendicular to the major plane of the semiconductor substrate; and
      the shortest line taken from the top surface of the first barrier wall to the second side of the first active region makes a second angle with respect to the axis depth than that of the second depth range, said first depth range overlapping the second depth range.

19. A method of implanting a semiconductor substrate comprising:
   forming a PMOS gate layer situated on a pad oxide layer upon an N-well within a monocrystalline semiconductor substrate that is situated within a major plane, said PMOS gate layer having an exposed portion thereof extending between a first barrier and a second barrier separated by a first length, said first barrier extending to a top surface, the PMOS gate layer extending upon the pad oxide layer from a first field oxide region to a second field oxide region, wherein the shortest line from the top surface of the first barrier to the second field oxide region makes a second angle with respect to an axis perpendicular to the major plane of the semiconductor substrate;
   forming an NMOS gate layer on a pad oxide layer upon a P-well within the monocrystalline semiconductor substrate, said NMOS gate layer having an exposed portion thereof extending between a third barrier and a fourth barrier, said third barrier extending to a top surface, wherein the shortest line from the top surface of the third barrier to the intersection of the fourth barrier with the NMOS gate layer makes a first angle with respect to the axis perpendicular to the major plane of the semiconductor substrate the third and fourth barriers being separated by a second length parallel to and less than the first length; and
   bombarding the semiconductor substrate with doping ions at a third angle with respect to the axis perpendicular to the major plane of perpendicular to the major plane of the semiconductor substrate;
   each of the first barrier wall, the second barrier wall, and the third barrier walls are separated one from another and comprise a layer of photoresist and an electrical insulation layer, and wherein each said layer of photoresist and the electrical insulation layer are patterned and etched simultaneously to simultaneously form the first barrier wall, the second barrier wall, and the third barrier walls; and
   bombarding the semiconductor substrate with both N-type and P-type doping ions at a third angle between about 1 degree to about 20 degrees with respect to the axis perpendicular to the major plane of the semiconductor substrate that is less than the second angle and greater than the first angle, the first active region having bombarded therein a greater concentration of P-type ions at a first depth and a greater concentration of N-type ions at a second depth greater than the first depth, and wherein the first active region has bombarded therein said P-type ions within at a first selected depth range and has bombarded therein said N-type ions within a second selected depth range, said first depth range being a shallower the semiconductor substrate that is less than the second angle and greater than the first angle.

20. A method of implanting a semiconductor substrate as recited in claim 19, wherein said third angle is a range of angles between about 1 degree to about 20 degrees.

21. A method of implanting a semiconductor substrate as recited in claim 19, wherein the doping ions are both N-type and P-type doping ions, and wherein a portion of the N-well below the PMOS gate layer has bombarded therein a greater concentration of P-type ions at a first depth and a greater concentration of N-type ions at a second depth greater than the first depth.

22. A method of implanting a semiconductor substrate as recited in claim 21, wherein the N-type and P-type doping ions will penetrate the PMOS gate layer while the doping ions are prevented from penetrating the NMOS gate layer by the third and fourth barriers.

23. A method of implanting a semiconductor substrate as recited in claim 21, wherein the P-type doping ions comprise boron ions and N-type doping ions comprise phosphorous ions.

24. A method of implanting a semiconductor substrate as recited in claim 19, wherein the first, second, third, and fourth barriers are separated one from another and each comprises a layer of photoresist and an electrical insulation layer, and wherein the first, second, third, and fourth barriers are formed simultaneously.

25. A method of implanting a semiconductor substrate as recited in claim 19, wherein said portion of the N-well below the PMOS gate layer has bombarded therein said P-type ions within at a first selected depth range, and has bombarded therein said N-type ions within a second selected depth range, said first depth range being a shallower depth than that of the second depth range, said first depth range overlapping the second depth range.

26. A method of implanting a semiconductor substrate comprising:
   forming a split polysilicon CMOS circuit structure including:
      a PMOS gate layer situated on a pad oxide layer upon an N-well within a monocrystalline semiconductor substrate that is oriented within a major plane, said PMOS gate layer having an exposed portion thereof extending between a first barrier and a second barrier separated by a first length, said first barrier extending to a top surface, the PMOS gate layer extending upon the pad oxide layer from a first field oxide region to a second field oxide region, wherein the shortest line from the top surface of the first barrier to the second field oxide region makes a second angle with respect to an axis perpendicular to the major plane of the semiconductor substrate;

an NMOS gate layer on a pad oxide layer upon a P-well within the monocrystalline semiconductor substrate, said NMOS gate layer having an exposed portion thereof extending between a third barrier and a fourth barrier, said third barrier extending to a top surface, wherein the shortest line from the top surface of the third barrier to the intersection of the fourth barrier with the NMOS gate layer makes a first angle with respect to the axis perpendicular to the major plane of the semiconductor substrate, the third and fourth barriers being separated by a second length parallel to and less than the first length, wherein the first, second, third, and fourth barriers are separated one from another and each comprises a layer of photoresist and an electrical insulation layer, and wherein the first, second, third, and fourth barriers are formed simultaneously; and bombarding the semiconductor substrate with doping ions at a third angle between about 1 degree to about 20 degrees with respect to the axis perpendicular to the major plane of the semiconductor substrate that is less than the second angle and greater than the first angle, wherein the doping ions are both N-type and P-type doping ions, and wherein a portion of the N-well below the PMOS gate layer has bombarded therein a greater concentration of P-type ions at a first depth and a greater concentration of N-type ions at a second depth greater than the first depth, and wherein said portion of the N-well below the PMOS gate layer has bombarded therein said P-type ions within at a first selected depth range, and has bombarded therein said N-type ions within a second selected depth range, said first depth range being a shallower depth than that of the second depth range, said first depth range overlapping the second depth range.

27. A method of implanting a semiconductor substrate comprising:

forming a split polysilicon CMOS circuit structure including:
a PMOS gate layer situated on a pad oxide layer upon an N-well within a monocrystalline semiconductor substrate that is oriented within a major plane, said PMOS gate layer having an exposed portion thereof extending between a first barrier and a second barrier separated by a first length, said first barrier extending to a top surface, the PMOS gate layer extending upon the pad oxide layer from a first field oxide region to a second field oxide region, wherein the shortest line from the top surface of the first barrier to the second field oxide region makes a second angle with respect to an axis perpendicular to the major plane of the semiconductor substrate;

a plurality of NMOS gate layers each:
on a pad oxide layer upon a P-doped well within the monocrystalline semiconductor substrate;
having an exposed portion thereof extending between a third barrier and a fourth barrier, said third barrier extending to a top surface, wherein the shortest line from the top surface of the third barrier to the intersection of the fourth barrier with the NMOS gate layer makes a first angle with respect to the axis perpendicular to the major plane of the semiconductor substrate, the third and fourth barriers being separated by a second length parallel to and less than the first length; and bombarding the semiconductor substrate with both N-type and P-type doping ions at a third angle with respect to the axis perpendicular to the major plane of the semiconductor substrate that is less than the second angle and greater than the first angle, a portion of the N-well below the PMOS gate layer having bombarded therein a greater concentration of P-type ions at a first depth and a greater concentration of N-type ions at a second depth greater than the first depth.

28. A method of implanting a semiconductor substrate as recited in claim 27, wherein said third angle is between about 1 degree to about 20 degrees.

29. A method of implanting a semiconductor substrate as recited in claim 27 wherein the P-type doping ions comprise boron ions and N-type doping ions comprise phosphorous ions.

30. A method of implanting a semiconductor substrate as recited in claim 27, wherein each of the first, second, third, and fourth barriers comprise a layer of photoresist and an electrical insulation layer, and wherein each said layer of photoresist and the electrical insulation layer are patterned and etched simultaneously to simultaneously form the first, second, third and fourth barriers.

31. A method of implanting a semiconductor substrate as recited in claim 27, wherein each said second length separating the first and second sides of each of said plurality of NMOS gate layers has substantially the same length.

32. A method of implanting a semiconductor substrate as recited in claim 27, wherein said portion of the N-well below the PMOS gate layer has bombarded therein said P-type ions within at a first selected depth range, and has bombarded therein said N-type ions within a second selected depth range, said first depth range being a shallower depth than that of the second depth range, said first depth range overlapping the second depth range.

33. A method of implanting a semiconductor substrate comprising:

forming a split polysilicon CMOS circuit structure including:
a PMOS gate layer situated on a pad oxide layer upon an N-well within a monocrystalline semiconductor substrate that is oriented within a major plane, said PMOS gate layer having an exposed portion thereof extending between a first barrier and a second barrier separated by a first length, said first barrier extending to a top surface, the PMOS gate layer extending upon the pad oxide layer from a first field oxide region to a second field oxide region, wherein the shortest line from the top surface of the first barrier to the second field oxide region makes a second angle with respect to an axis perpendicular to the major plane of the semiconductor substrate;

a plurality of NMOS gate layers each:
on a pad oxide layer upon a P-doped well within the monocrystalline semiconductor substrate;
having an exposed portion thereof extending between a third barrier and a fourth barrier, said third barrier extending to a top surface, wherein the shortest line from the top surface of the third barrier to the intersection of the fourth barrier with the NMOS gate layer makes a first angle with respect to the axis perpendicular to the major plane of the semiconductor substrate, the third and fourth barriers being separated by a second length parallel to and less than the first length;

wherein each of the first, second, third, and fourth barriers are separated one from another and comprise a layer of photoresist and all electrical insulation layer, and wherein each said layer of photoresist and the electrical insulation layer are patterned and etched simultaneously to simultaneously form the first, second, third, and fourth barriers; and bombarding the semiconductor substrate with both N-type and P-type doping ions at a third angle in a range of angles between about 1 degree to about 20 degrees with respect to the axis perpendicular to the major plane of the semiconductor substrate that is less than the second angle and greater than the first angle, a portion of the N-well below the PMOS gate layer having bombarded therein a greater concentration of P-type ions at a first depth and a greater concentration of N-type ions at a second depth greater than the first depth, wherein said portion of the N-well below the PMOS gate layer has bombarded therein said P-type ions within at a first selected depth range and has bombarded therein said N-type ions within a second selected depth range, said first depth range being a shallower depth than that of the second depth range, said first depth range overlapping the second depth range.

* * * * *

UNITED STATES PATENT AND TRADEMARK OFFICE
CERTIFICATE OF CORRECTION

PATENT NO.    : 6,040,208
DATED         : March 21, 2000
INVENTOR(S)   : Jeffrey W. Honeycutt; Fernando Gonzalez; Fawad Ahmed It is certified that error appears in the above-identified patent and that said Letters Patent is hereby corrected as shown below:

Column 5,
Line 48, change "θhd 3so" to -- $\theta_3$ so --

Column 7,
Line 37, after "due" insert -- to --

Column 8,
Line 35, after "PMOS" change "gates" to -- gate --
Line 44, after "that" change "has" to -- was --

Column 13,
Line 63, after "subsrate" insert a comma

Column 14,
Line 1, delete "perpendicular to the major plane of "
Line 21, change "within at a" to -- within a -
Line 24-26, change "shallower the semiconductor substrate that is less than that of the second angle and greater than the first angle" to --shallower depth than that of the second depth range, said first depth range overlapping the second depth range --

Column 15,
Line 2, after "first" change "harrier" to -- barrier --

UNITED STATES PATENT AND TRADEMARK OFFICE
CERTIFICATE OF CORRECTION

PATENT NO.    : 6,040,208
DATED         : March 21, 2000
INVENTOR(S)   : Jeffrey W. Honeycutt; Fernando Gonzalez; Fawad Ahmed It is certified that error appears in the above-identified patent and that said Letters Patent is hereby corrected as shown below:

Column 16,
Line 64, after "fourth" change "harrier" to -- barrier --

Column 17,
Line 8, after "and" change "all" to -- an --

Signed and Sealed this

Twenty-first Day of August, 2001

*Attest:*

*Attesting Officer*

NICHOLAS P. GODICI
*Acting Director of the United States Patent and Trademark Office*